United States Patent [19]

Bakeman, Jr. et al.

[11] 4,369,072
[45] Jan. 18, 1983

[54] METHOD FOR FORMING IGFET DEVICES HAVING IMPROVED DRAIN VOLTAGE CHARACTERISTICS

[75] Inventors: Paul E. Bakeman, Jr., Shelburne, Vt.; Andres G. Fortino, Bryn Mawr, Pa.; Henry J. Geipel, Jr.; Jeffrey P. Kasold, both of Essex Junction, Vt.; Robert M. Quinn, South Burlington, Vt.

[73] Assignee: International Business Machines Corp., Armonk, N.Y.

[21] Appl. No.: 227,567

[22] Filed: Jan. 22, 1981

[51] Int. Cl.³ ............... H01L 21/263; H01L 21/22; H01L 7/00; H01L 21/265
[52] U.S. Cl. ............................... 148/1.5; 29/571; 29/576 B; 148/187; 357/91
[58] Field of Search ........... 148/1.5, 187; 357/91; 29/571, 576 B

[56] References Cited

U.S. PATENT DOCUMENTS

| | | | |
|---|---|---|---|
| 3,798,079 | 3/1974 | Chu et al. | 148/33.5 |
| 3,812,519 | 5/1974 | Nakamura et al. | 317/234 R |
| 3,840,306 | 10/1974 | Raabe et al. | 357/14 |
| 3,879,230 | 4/1975 | Nakamura et al. | 148/190 |
| 3,897,276 | 7/1975 | Kondo | 148/1.5 |
| 4,028,717 | 6/1977 | Joy et al. | 357/23 |
| 4,070,687 | 1/1978 | Ho et al. | 357/23 |
| 4,099,998 | 7/1978 | Ferro et al. | 148/187 |
| 4,106,953 | 8/1978 | Onodera | 148/1.5 |
| 4,111,719 | 9/1978 | Mader et al. | 148/1.5 |
| 4,111,720 | 9/1978 | Michel et al. | 148/1.5 |
| 4,133,701 | 1/1979 | Greenstein et al. | 148/1.5 |
| 4,133,704 | 1/1979 | MacIver et al. | 148/1.5 |
| 4,144,100 | 3/1979 | MacIver et al. | 148/1.5 |
| 4,155,777 | 5/1979 | Dunkley et al. | 148/1.5 |
| 4,298,401 | 11/1981 | Nuez et al. | 148/187 |
| 4,305,201 | 12/1981 | Tiefert | 29/571 |
| 4,306,916 | 12/1981 | Wollesen et al. | 148/1.5 |

FOREIGN PATENT DOCUMENTS 2056168 11/1981 United Kingdom ............... 148/190

OTHER PUBLICATIONS

Stoneham et al. Jour. Electronic Materials, 9 (1980) 371.
Edel et al. IBM-TDB, 13 (1970) 632.
Bartholomew et al. IBM-TDB, 21 (1978) 1554.
Stolte, C. A. in Ion Implantation in Semiconductors 1976, ed. Chernow et al., Plenum, N.Y. 1977, p. 149.
B. K. Aggarwal, "Emitter Structure . . . ", IBM Tech. Discl. Bull., vol. 19, No. 1, Jun. 1976, pp. 162-163.
H. Yagi et al., "A Novel Bipolar Device . . . ", Tech. Digest 1974 IEDM, Wash., D.C., Dec. 9, 10, 11, 1974, pp. 262-265.
R. Heckingbottom et al., Radiation Effects, "Ion Implantation in Compound Semiconductors . . . ", vol. 17, pp. 31-36, 1973.

*Primary Examiner*—Upendra Roy
*Attorney, Agent, or Firm*—Howard J. Walter, Jr.

[57] ABSTRACT

A method of providing less than one micron p-n junction regions for IGFET devices in which a high concentration of arsenic is implanted so that its peak lies near the surface of a semiconductor substrate. Phosphorus is also implanted with an energy to provide a maximum concentration below that of the arsenic and of a magnitude at least one order of magnitude less than that of arsenic. An oxidation/anneal step thermally diffuses the implanted ions to form a junction less than one micron in thickness.

12 Claims, 5 Drawing Figures

METHOD FOR FORMING IGFET DEVICES HAVING IMPROVED DRAIN VOLTAGE CHARACTERISTICS

BACKGROUND OF THE INVENTION

1. Field of the Invention

This invention relates to methods of fabricating field-effect semiconductor devices and more particularly to a method of providing IGFET devices having junction depths of less than one micron which can sustain high voltages while possessing low sheet resistivity and low capacitance.

2. Description of the Prior Art

Traditionally, n-channel IGFET source/drain junctions have been formed by thermal solid state diffusion techniques using various dopant sources. Recent trends to reduce the horizontal geometry of such devices have also required that vertical geometries also be reduced along with corresponding reductions in operating potentials and power. Very large scale integration techniques require IGFET junction depths on the order of 0.2 to 1.0 micron. Solid state diffusion techniques have proved to be unsuitable for the formation of such junctions because of a number of undesirable characteristics including the inability to provide adequately low sheet resistance with the required junction depths. In addition, impurity concentration profiles resulting from surface diffusion are often inadequately steep and result in increased junction capacitance as well as increased reverse bias leakage levels. Ion implantation is now preferred for providing source/drain regions in IGFETs as ion implantation enables better selection of impurity species, more accurate control of impurity concentration and profile and is particularly adapted to self-aligned processing techniques.

The use of ion implantation as a doping technique causes physical damage to the semiconductor crystal and thermal annealing of the implanted crystal becomes of prime importance in any ion implantation process. Remaining or residual damage, when made electrically active by precipitation effects can enhance reverse bias junction leakage if these defects lie near the p-n junction depletion region. A preferred technique, therefore, has been to utilize ion implantation as a prediffusion source and to follow the ion implantation with a thermal diffusion/anneal process in order to enable the dopant species to diffuse beyond damaged crystal sites and become electrically active. Implant/diffusion processes are particularly important in those instances when a screen oxide is used to protect the silicon semiconductor surface from implant-introduced surface contamination, which provides an additional defect producing phenomenon caused by the presence of excess oxygen atoms in the crystal.

As a result of numerous experiments arsenic has become the preferred n-type dopant species for making source/drain regions of n-channel polysilicongate IGFETs, primarily because of the ability to achieve relatively low resistivity shallow junction having low leakage characteristics in a simple implant/diffusion process.

The reduction of device geometries also has some inherent limitations. For example, the reduction in device size, particularly channel length, causes a decrease in the drain voltage at which low-level avalanche, junction breakdown and/or punch-through occur, see for example the article, "Drain Voltage Limitations of MOS Transistors," J. M. Bateman et al., *Solid-State Electronics*, Vol. 17, pp. 539–550 (June 1974). Such drain voltage limitations impose restrictions on the design of IGFET devices with respect to one or more of: drain voltage supply, channel length, diffusion depth, diffusion concentration profile, substrate doping level, channel doping level, etc.

Although many applications for very large scale integrated circuits often utilize the inherent advantage of lower supply voltages, current processes are normally designed to operate properly at a drain voltage supply source of 5 volts or less. However, in certain applications such as in performance driven designs and in electrically programmable read only memories, it is desirable to provide a process which is tolerant of higher level supply voltages.

As described above, the primary concern relating to source/drain region design is the ability to withstand various breakdown phenomena and to provide low leakage current.

For example, as described in U.S. Pat. No. 3,798,079 to Chu et al., it is known that the avalanche breakdown voltage of a p-n junction can be increased by providing a flattened dopant concentration profile by the simultaneous thermal diffusion of two elements of the same dopant type but having different diffusion rates such that the faster diffusing element is driven deeper into the substrate than that of the slower. Such simultaneous surface diffusion techniques have also been used to control the concentration profile of the buried side of a p-n junction in order to control the capacitance of a p-n junction, as taught by U.S. Pat. No. 3,840,306 to Raabe et al. Similar results can also be achieved by sequential ion implantation/diffusion processes using the same impurity element as taught by U.S. Pat. No. 4,106,953 to Onodera. Such techniques although providing some degree of control of the dopant concentration profile are suitable only for forming p-n junctions having a depth of several microns, many times greater than that required for very large scale integrated circuit devices.

Multiple dopant diffusion techniques for reducing low level avalanche conditions at the drain electrode of IGFET devices are also known which rely on control of the dopant concentration profile at the drain end of the channel of an IGFET. U.S. Pat. No. 4,028,717 to Joy et al. teaches a drain junction formed from concentric diffusions or ion implantation regions. A first low concentration region formed with a maximum concentration below the semiconductor surface effectively forms the drain electrode. A second high concentration region lies inside the first region and has a concentration peak near the semiconductor surface to provide a low resistivity contact to the first region. The two regions are defined separately and require separate mask and photoresist steps. U.S. Pat. No. 4,070,687 to Ho teaches a similar approach to the same problem but uses only one masking step. Here two dopants, arsenic and phosphorus are diffused or ion implanted to provide a high surface concentration and subsequently diffused to form an n+, p−, p junction due to the difference in diffusion rates.

U.S. Pat. No. 3,897,276 to Kondo may also be of interest as it teaches a double ion implantation method of forming a junction from as-implanted ions without subsequent diffusion in which a p+, p, n, n+ junction is formed in a semiconductor substrate. Ions of a relatively high atomic mass, indium, are implanted at a low concentration relatively deep below the surface of a silicon substrate and at least one implant of a low mass ion, boron, of the same impurity type is implanted with a high concentration near the surface of the substrate to form an IMPATT diode. The p-n junction portion of the device is controlled by the smaller straggling range of the heavier ion in the substrate and thus provides a step-like concentration profile at the metallurgical junction.

The article "Emitter Structure with Different Impurity Concentrations" by B. K. Aggarwal, *IBM Technical Disclosure Bulletin*, (19) 1, pp. 162-3 (June 1976) and the article referenced therein, "A Novel Bipolar Device with Low Emitter Impurity Concentration Structure," by H. Yagi et al., *Technical Digest* 1974 *International Electron Devices Meeting*, Dec. 9, 10 and 11, 1974, pp. 262-265, also may be of interest. These articles relate to methods of forming NPN bipolar transistor devices which have a n+, n, p+, n junction structure. Yagi et al., teaches the formation of the n+, n emitter region by the thermal diffusion of a high concentration of phosphorus into a 2 ohm-centimeter n-type epitaxial layer. Aggarwal suggests three alternative techniques for forming the emitter of Yagi et al. A first, similar to Onodera above, uses sequential implantation and anneal steps of a shallow high concentration of arsenic followed by a deeper high concentration of phosphorus resulting in a composite n-type emitter at least several microns in depth. The second uses a single shallow implantation step of a high concentration of arsenic followed by thermal diffusion of a high concentration of phosphorus. The third uses the combination of the first alternative but is annealed in a standard bipolar drive-in environment.

Other two-specie ion implantation junction forming techniques are also known, particularly for reducing the effects of ion implant caused defects and crystal lattice strain. For example MacIver and Greenstein in their U.S. Pat. Nos. 4,133,701; 4,133,704 and 4,144,100 respectively teach enhancing the diffusion depth of phosphorus in bipolar transistors by implanting phosphorous regions with a halogen to create an amorphous surface prior drive-in; providing low leakage p-n junctions by implanting an inert specie to amorphize the surface prior to drive-in in a wet oxidation atmosphere; and forming low leakage, low concentration n-p junctions by ion implanting halogens or silicon to amorphize the doped surface prior to a wet oxidation drive-in.

U.S. Pat. No. 3,812,519 to Nakamura et al. is of interest as it relates to ion implantation techniques for forming high concentration bipolar emitter regions having reduced emitter dip effect by the surface diffusion of both arsenic and phosphorous having a concentration ratio, of arsenic to phosphorus atoms of from 4 to 40:100. The presence of the arsenic is intended to prevent lattice collapse, thus allowing a higher surface concentration to be achieved. U.S. Pat. No. 4,111,719 to Mader et al. teaches achieving a similar result in which a silicon substrate which has been ion implanted with arsenic at 80 KeV with a dose of $2 \times 10^{16}$ ions/cm$^2$ (hereafter such powers of 10 will be expressed as 2E16 ions/cm$^2$), resulting in a peak concentration of arsenic near the solid solubility of arsenic in silicon, is also implanted with germanium at a dose of 2E15 ions/cm$^2$ at 75 KeV and then annealed.

In summary, while the prior art teaches a variety of junction formation techniques both to provide controlled dopant concentration profile for various types of devices and to provide improved junction quality by reduction of leakage causing defects of the crystalline structure in the vicinity of junctions, the fabrication of shallow junctions of less than one micron depth with adequate low resistivity, high breakdown voltage, high sustaining voltage, low capacitance and low reverse bias leakage suitable for use in forming junctions in very large scale integrated circuit IGFET devices has not been provided.

SUMMARY OF THE INVENTION

Accordingly, it is an object of this invention to provide junction regions having a junction depth of less than one micron having all of the desired properties for use in very large scale integrated circuits which are capable of operating reliably under higher voltages without impacting device design constraints.

It is also an object to provide improved IGFET devices capable of operating at higher supply potentials.

These and other objects are accomplished by the use of a double ion implantation process followed by an oxidizing drive-in process in which a first conductivity determining impurity ion of a first type is implanted into a substrate of a second type through a screen oxide to provide a maximum impurity concentration at the oxide/substrate interface of a magnitude in excess of that required to achieve maximum electrical solubility of the impurity in the substrate. A second conductivity determining impurity ion of the first type is also implanted through the screen oxide to provide a maximum concentration at a depth below that of the first impurity and having a maximum concentration at least one order of magnitude less than that of the first impurity. An oxidizing drive-in annealing process causes thermal diffusion of both of the implanted impurities to provide a junction having a first portion of its electrically active impurity concentration profile equal to that of the maximum electrical solubility of the first impurity in the substrate which extends to a depth greater than that of the maximum concentration of the second impurity as-implanted, a second portion of lower concentration determined by the first and second impurities which substantially determines the electrical breakdown characteristics of the junction, and a third portion determined by the second impurity. Arsenic and phosphorus are preferred as the first and second impurities, respectively.

The foregoing and other objects, features and advantages of the invention will be apparent from the more particular description of the preferred embodiment of the invention, as illustrated in the accompanying drawings.

DESCRIPTION OF THE PREFERRED EMBODIMENT

Figure 1:
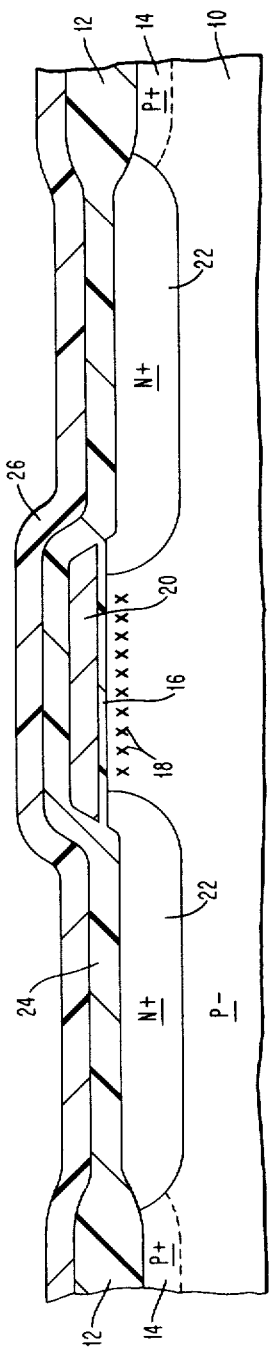
FIG. 1 is a schematic sectional view of a polysilicon gate, self-aligned field effect transistor fabricated by the ion implantation process of the invention showing the relationship between the various features affecting device performance.

The preferred embodiment of this invention is described in conjunction with a particular process for providing self-aligned polysilicon gate IGFET devices. FIG. 1 illustrates a typical IGFET device fabricated by the process, although any similar process having more or less features may also be used to practice the invention. Generally, the preferred process may be implemented as follows. Starting with a boron doped silicon semiconductor wafer 10, of about 12 ohm-centimeter resistivity and having its major surface parallel to the 100 crystalline plane, a thin thermal silicon dioxide layer is grown followed by the chemical vapor deposition of a silicon nitride layer. This composite layer is patterned by known photolithographic masking and etching techniques to remove the silicon nitride in areas where devices are to be formed. A field threshold voltage tailoring step is performed by ion implanting boron ions at an energy of about 80 to 150 KeV and a dosage of about 1 to 5E13 ions/cm$^2$. This is followed by the thermal oxidation of the wafer in a dry-wet-dry oxidation atmosphere to provide about 5000 to 10,000 angstroms of semi-recessed dielectric oxide 12, generally referred to as ROX, in all areas of the wafer not protected by the previously defined silicon nitride layer. The ion implanted boron diffuses faster than the surface of the wafer is oxidized to provide p+ type semiconductor regions 14 under ROX regions 12 which act as channel stoppers between active device areas by raising the inversion threshold voltage under the ROX areas. The remaining oxide/nitride masking layer is then removed by etching followed by the thermal growth of 150 to 800 angstroms of silicon dioxide which will act as the gate insulator layer 16. In order to provide positive enhancement IGFET threshold voltages boron is next ion implanted at an energy of about 30 to 100 KeV and a dose of about 1E11 to 2E12 ions/cm$^2$, as represented by the small x's 18 in the channel region. Next phosphorus doped polysilicon is deposited by chemical vapor deposition to a thickness of about 1000 to 5000 angstroms. If a double polysilicon process is desired a layer of pyrolytic silicon dioxide may be deposited at this point followed by patterned etching of the oxide covered polysilicon, removal of thin thermal oxide not protected by polysilicon, subsequent thermal oxidation of the substrate surface and exposed polysilicon edges and deposition of a second doped polysilicon layer. In either a single or double layer polysilicon process the last deposited layer of polysilicon is etched to form IGFET gate electrodes 20 retaining or removing and regrowing the gate dielectric over remaining portions of the substrate to act as an ion implantation screen in the next step.

Source and drain regions are next formed by the two-step ion implantation/drive-in process using both the polysilicon and ROX areas as a mask. Previous experience had indicated that arsenic ions implanted at an energy of about 20 to 120 KeV, depending upon the gate insulator/screen oxide thickness, with a dose of 3E15 to 1.2E16 ions/cm$^2$ followed by an oxidizing drive-in process will provide satisfactory source/drain regions having a junction depth of less than 1.0 microns. The oxidation process provides an oxide layer 24 over polysilicon gate electrode 20 and implanted source/drain regions. The drive-in process is followed by deposition of passivating phosphorus doped glass layer 26 followed by an anneal step in nitrogen. The resulting junctions 22 provide adequate electrical breakdown and leakage characteristics for use in integrated circuits powered by drain supply voltage on the order of about 5.0 volts.

The above processing parameters were also believed to provide adequate electrical characteristics for integrated circuits powered by supply voltages as high as 8.5 volts. It was subsequently discovered that significant voltage limitations existed that were not previously known. These limitations are primarily directed to reduced device breakdown voltage and reduced sustaining voltage. Since device breakdown voltage is dependent on junction depth and profile, substrate doping and gated diode effects and since sustaining voltage is dependent on IGFET parameters such as channel length and gate oxide thickness, minimum device geometry is clearly affected when applications using higher supply voltages are intended. Density penalties of up to 15 percent can be expected for dynamic random access memory designs and are only slightly less for logic or charge-coupled device designs.

In order to eliminate these voltage limitations so that circuits designed for the higher 8.5 volt supplies would not be hindered by numerous electrical design constraints, experimental work was initiated to improve device breakdown and sustaining voltages without major process or design changes. It was intended that such improvements should have a minimal impact on device electrical parameters and physical ground rules. Previous data from devices produced by the above described process and computer simulations indicated that apart from horizontal device geometries and substrate resistivity effects, the most significant parameters affecting device sustaining voltage were the junction parameters themselves. These include junction depth, junction concentration gradient and junction shape under the polysilicon gate electrode. For junction donor doping levels at or above solid solubility which already existed in the process, sheet resistance of the diffused regions is determined by junction depth and junction concentration gradient. Experimental data previously gathered for junction depths in the 0.3 to 0.5 micron range indicated little variation of device sustaining voltage. Thus, experiments directed to altering the concentration profile of the implanted and diffused arsenic were initiated. One experiment utilized a double implantation of arsenic at two different energy levels, four experiments utilized a double implantation of arsenic and phosphorus, and one experiment consisted of the previous single arsenic implantation process as a control.

The control or standard arsenic process steps related specifically to the source drain junction formation consisted of the following steps.

1. Following definition of the polysilicon gate electrode the semiconductor wafers, (Group A) were cleaned using a combination acid wash, brush clean and ammonium hydroxide/hydrogen peroxide/water rinse.

2. Arsenic (75 As+) was pre-deposited by ion implanting through the screen oxide at 80 KeV with a dose of 8E15 ions/cm$^2$ in a commercial ion implantation tool.

3. Implanted wafers were then post-implant cleaned.

4. A dry/wet/dry oxidizing-anneal step followed consisting of 10 minutes in oxygen, 18 minutes in water/HCl, 40 minutes in oxygen and 45 minutes in nitrogen at 1000° C. This produced about 2500 angstroms of oxide over the polysilicon gate.

5. A passivation layer of phosphosilicate glass (PSG) about 2500 angstroms was deposited at 750° C. in a barrel reactor.

6. A PSG anneal consisting of 12 minutes in nitrogen at 1050° C. completed the junction formation.

The other experimental wafers were made by modifying step 2 as follows:

Group A':
 75 As+ at 170 KeV, dose: 3.56E15/cm$^2$ plus
 75 As+ at 80 KeV, dose: 3.44E15/cm$^2$.

Group B:
 75 As+ at 80 KeV, dose: 8E15/cm$^2$ plus
 31 P+ at 140 KeV, dose: 1.9E13/cm$^2$.

Group C:
 75 As+ at 80 KeV, dose: 8E15/cm$^2$ plus
 31 P+ at 140 KeV, dose: 6.0E13/cm$^2$.

Group D:
 75 As+ at 80 KeV, dose: 8E15/cm$^2$ plus
 31 P+ at 140 KeV, dose: 1.9E14/cm$^2$.

Group E:
 75 As+ at 80 KeV, dose: 8E15/cm$^2$ plus
 31 P+ at 140 KeV, dose 6E14/cm$^2$.

All of the wafers were run under conditions which were expected to provide arsenic metallurgical junction regions of 0.5 microns depth into the silicon surface and having a sheet resistivity of 18 ohms per square.

The double arsenic experiment, group A', was run because earlier experiments had indicated that similar implant conditions provided more graded concentration profiles than obtainable with a single implant of arsenic.

The four arsenic plus phosphorus experiments, groups B-E, all contain the same arsenic implant conditions as the standard, group A, followed by various doses of phosphorus at an energy of 140 KeV. The arsenic energy is intended to provide a peak concentration at the screen oxide-silicon interface so that subsequent thermal diffusion would determine the final concentration profile at a depth below that in which substantial crystal damage occurs by the arsenic implant process. The phosphorus energy was selected to give a projected range of 1757 angstroms with a sigma of 595 angstroms. Reasons for selecting this energy were twofold. First, the range must be limited such that the phosphorus does not penetrate the polysilicon gate and the gate oxide which would alter the IGFET threshold voltage. Second, it was desired to implant the phosphorus significantly below the arsenic implant in order to aid in its diffusion beyond the expected arsenic metallurgical junction.

Doses for phosphorus were selected to bracket the 1E17 to 1E19 ions/cm$^3$ phosphorus peak concentration regions for uniform distributions over the 0.5 micron deep arsenic doped regions. Simple one-dimensional solutions to Poisson's equation suggest the grading of the junction at concentration less than that below 1E17/cm$^3$ would have a very small effect on the electric field distribution under low level avalanche multiplication conditions occuring near the drain diffusion. Higher phosphorus doses were not used because the resulting structures were expected to appear like all-phosphorus source/drain regions with deep junctions providing excessive channel length reduction, excessive gate overlap capacitance, excessive junction capacitance and degraded electrical performance.

Figure 2:
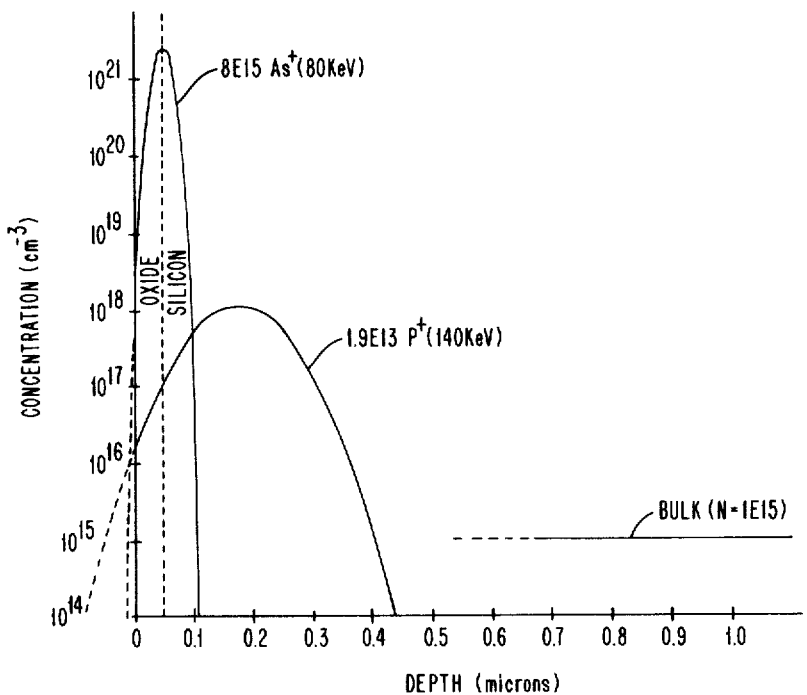
FIG. 2 is a graphical representation of the dopant impurity concentration profiles of arsenic and phosphorus immediately following their implantation into the semiconductor wafer.

Predicted Gaussian concentration profiles of as-implanted arsenic and phosphorus for Group B wafers are shown in FIG. 2. Ions which are theoretically predicted to lie outside the target surface, as shown by dashed lines, are assumed to accumulate at the surface, increasing the ion density there above the Gaussian prediction. The peak arsenic concentration for arsenic lies at the interface between the screen oxide and the silicon surface and is substantially at or above the maximum solid solubility of arsenic in silicon. The peak phosphorus concentration lies considerably deeper in the silicon and is about three orders of magnitude less than that of the arsenic and about two orders of magnitude greater than the background concentration of acceptors in the bulk portion of the wafer.

Figure 3:
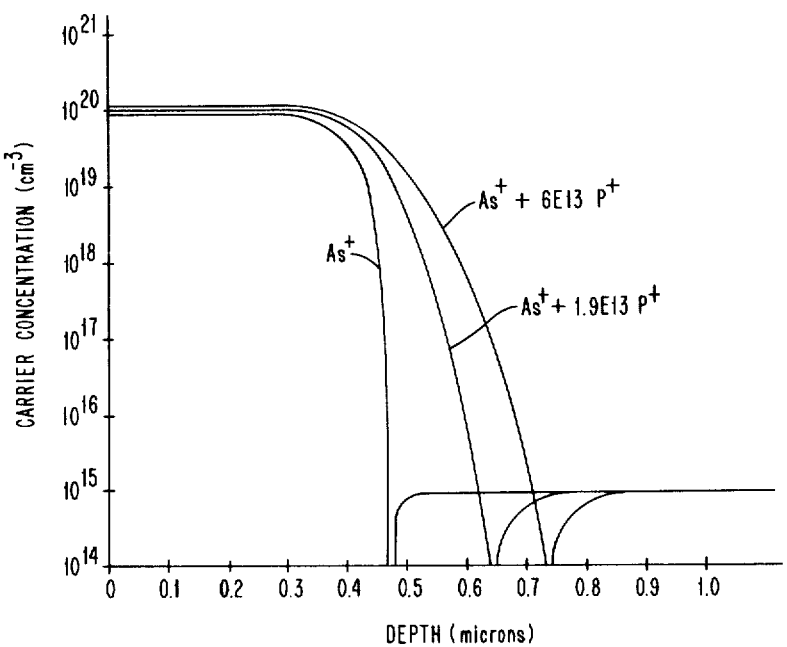
FIG. 3 is a graphical representation of the active total carrier concentration profile of both a single implantation of arsenic and the double implantation of arsenic and phosphorus and illustrates the reduction in the slope of the carrier concentration profile without substantially increasing junction depth.

Physical analysis results of the junction dopant concentration profiles taken by the spreading resistance technique for arsenic alone and the two low dose arsenic plus phosphorus, Groups B and C, are shown in FIG. 3. The metallurgical junction depths were measured at 0.46, 0.65 and 0.73, respectively for each group. Electrically the junction depths may appear shallower than the metallurgical junction due to the depletion of carriers during normal reverse biased operation of devices. The depth at which the donor level drops below that of the acceptors in the implanted channel region is about 0.46, 0.58, and 0.67 microns respectively.

From a first order integration of the numerical donor profiles of arsenic plus phosphorus two unexpected results are noted:

1. The total donor concentration beyond the 0.46 micron depth of the standard arsenic process is greater than that of the total phosphorus implanted dose.

2. The diffusion of the combination of implanted arsenic plus phosphorus does not appear to be a simple superposition of arsenic and phosphorus diffusing independently, nor does it appear that the arsenic and phosphorus diffuse with diffusion constants determined solely by the total donor concentration.

The arsenic plus phosphorus diffusion profiles also show compensation of the background boron concentration near the junction which does not appear on the arsenic profile.

Figure 4:
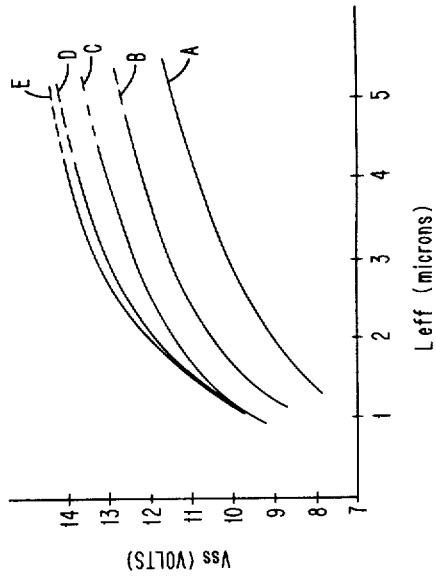
FIG. 4 is a graphical representation of the effect of both single and double implantion processes on the sustaining voltage of a p-n junction illustrating the increase in sustaining voltage achieved with the double ion implantation method of the invention.

FIG. 4, shows the effect on minimum sustaining voltage, Vss, versus effective channel length, Leff, for all groups except that for the double arsenic implant. Clearly indicated is a positive trend in Vss with increasing phosphorus dose providing between 1.5 to 3.0 volts increase in Vss for an Leff of 2 microns. The double arsenic group, although not shown in FIG. 4, showed no significant improvement in Vss.

Table I exhibits some additional electrical characteristics determined from test data and shows no substantial difference in channel shortening ΔL as indicated in the second column, a decrease in sheet resistivity with increasing phosphorus dose and an increase in junction breakdown voltage to ROX, VBPN.

TABLE I

| Group | ΔL (microns) | Resistivity (ohms per square) | VBPN (volts) |
|---|---|---|---|
| A | — | 17.6 | 19.3 |
|  | 2.1 |  | 19.5 |
|  | 1.9 |  | 21.3 |
|  | 2.0 |  | 19.6 |
|  | 2.3 |  | 19.8 |
|  | 2.2 |  | 19.6 |
|  | 1.6 | 17.6 | 20.5 |
|  | 2.2 |  | 20.0 |
|  | 1.9 |  | 18.4 |
| A (mean) | 2.0 | 17.6 | 19.8 |
| A' | 2.1 | — | 17.5 |
|  | — | — | 18.6 |
| B | 2.1 | 17.3 | 22.7 |
|  | — | 17.0 | 23.0 |
| C | 2.2 | 17.1 | 22.8 |
|  | 2.1 | 21.0 | 22.9 |
| D | 2.4 | 16.6 | 22.1 |
|  | 2.5 | 16.5 | 22.4 |
| E | — | 13.2 | 22.6 |
|  | — | 15.3 | 21.5 |

In addition, gated breakdown voltage at the channel side of the drain diffusion also shows an improvement similar to that of VBPN. There was no significant difference in threshold voltage lowering for short channel devices despite the increase in junction depths in the arsenic plus phosphorus wafers.

Junction area capacitance measurements showed a 0 to 5 percent decrease for the two lower dose phosphorus groups over that of the standard arsenic wafers. Junction to adjacent ROX capacitance was found to increase 5-10 percent for the two low dose phosphorus wafers. This is most likely due to the deeper junctions causing an increase in the sidewall area between the diffusions and the p+ regions under the ROX, therefore increasing total capacitance which is not compensated by the reduction in capacitance per unit of sidewall area caused by the more graded junction doping profile.

Figure 5:
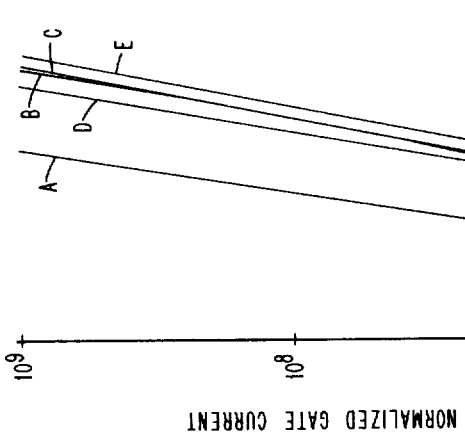
FIG. 5 is a graphical representation of the effect of the double ion implantation method of the invention on the gate current of a field effect transistor illustrating a reduction in gate current over similar transistors fabricated with a single implantation of arsenic.

The effect of the arsenic plus phosphorus on channel hot electron sensitivity is shown in FIG. 5 where normalized gate current is plotted versus gate and drain to substrate bias voltage. All of the arsenic plus phosphorus groups B-E show an increase of about 1 volt gate/drain bias for a fixed gate current over that of arsenic alone. Thus, IGFET device threshold shifts due to hot electron effects will be reduced significantly. In summary, a process has been described which provides substantial relief in device sustaining voltage and junction breakdown voltage with minimal impact on process complexity or electrical and layout groundrules for integrated circuit technologies having junctions of less than 1 micron depth.

Those skilled in the art will recognize that although the invention has been described in terms of a single embodiment various modifications may be made within the scope of the invention.

What is claimed is:

1. The method of providing p-n junction regions in a silicon semiconductor substrate of a predetermined first conductivity type having a predetermined impurity concentration, comprising the steps of:
   providing an ion implantation inhibiting means over selected portions of a surface of said silicon substrate;
   ion implanting first and second different impurities of a second conductivity determining type into said substrate, said first impurity being implanted at portions of said surface not provided with said inhibiting means, the implanting energy level of said first impurity providing a maximum concentration of said first impurity substantially at said surface and being of a dosage at least equal to that required to provide maximum solid solubility of said first impurity in said substrate, said second impurity being implanted into at least some of the same portions of said surface as said first impurity, the dosage of said second impurity being at least one order magnitude less than that of said first impurity, and
   heating said substrate in an oxidizing atmosphere and then in a non-oxidizing atmosphere to cause thermal oxidation of the surface of the substrate and thermal diffusion of the implanted concentration profiles of said first and second impurities in said substrate to form a diffused p-n junction at a depth of less than one micron below the oxidized surface of said substrate, said junction having an electrically active impurity concentration profile including a first portion nearest said surface and extending to a depth greater than the depth of the maximum concentration of said second impurity as implanted, said first portion having a concentration substantially equal to the solid solubility of said first impurity in said substrate, a second intermediate concentration portion having a concentration less than that of said first portion and greater than the concentration of the superposition of expected diffused concentration profiles of either of said first and second impurities and a third portion having a concentration less than said second portion, whereby the sheet resistivity of said junction is determined substantially by said first portion of said profile and the maximum voltage limitations of said junction are determined substantially by said second portion of said profile.

2. The method of claim 1 wherein said second impurity is implanted with an energy level to provide a maximum concentration at a depth in said substrate greater than that of the maximum concentration of said first impurity.

3. The method of claim 1 wherein said semiconductor substrate comprises silicon and said first and second impurities are arsenic and phosphorous, respectively.

4. The method of claim 1 wherein the areas of said substrate into which said impurities are implanted is covered by a screen oxide, and the maximum concentration of said first impurity as implanted occurs substantially at the interface between said screen oxide and said surface.

5. The method of claim 4 wherein said first impurity is arsenic implanted at a dosage of between $3 \times 10^{15}$ and $1.2 \times 10^{16}$ ions/cm$^2$ and said second impurity is phosphorus implanted at a dosage of between $1 \times 10^{13}$ and $6 \times 10^{14}$ ions/cm$^2$.

6. The method of claim 1 wherein said heating step includes exposing said implanted substrate to an oxidizing atmosphere including a wet oxidation step.

7. The method of claim 6 wherein said oxidizing atmosphere includes dry-wet-dry oxidizing atmospheres.

8. The method of claim 7 wherein said heating step further includes a thermal annealing step in a non-oxidizing atmosphere comprised of substantially nitrogen.

9. The method of forming diffused regions for a self-aligned gate IGFET device comprising the steps of:

providing a p-type silicon semiconductor substrate having on a surface thereof a thick oxide covering a first portion and an insulated gate electrode layer covering a second portion of said surface;

ion implanting first and second n-type impurities into a third portion of said surface at least partially defined by said gate electrode and said thick oxide, said first n-type impurity being implanted such that it has a maximum concentration substantially equal to its solid solubility in said substrate located substantially at said surface and said second impurity being implanted such that its maximum concentration is at least one order of magnitude less than that of said first impurity and being at a depth substantially below said surface, exposing said implanted substrate to thermal oxidation process and then to an annealing process to cause oxidation of said surface and to cause said first and second impurities to diffuse from their as implanted positions into said substrate to form an n-type diffused region in said substrate having a thickness less than one micron.

10. The method of claim 9 wherein said first impurity is arsenic and said second impurity is phosphorus.

11. The method of claim 9 wherein a screen oxide having a thickness of less than 1000 angstroms is provided over said third portion of said surface prior to said ion implanting step.

12. The method of claim 9 wherein said third portion of said surface corresponds only to the drain electrode region of said IGFET.

* * * * *